United States Patent
Furuta et al.

(10) Patent No.: US 10,468,221 B2
(45) Date of Patent: Nov. 5, 2019

(54) SHADOW FRAME WITH SIDES HAVING A VARIED PROFILE FOR IMPROVED DEPOSITION UNIFORMITY

(71) Applicant: Applied Materials, Inc., Santa Clara, CA (US)

(72) Inventors: Gaku Furuta, Sunnyvale, CA (US); Soo Young Choi, Fremont, CA (US); Yi Cui, San Jose, CA (US); Robin L. Tiner, Santa Cruz, CA (US); Jinhyun Cho, Santa Clara, CA (US); Jiarui Wang, San Jose, CA (US); Suhail Anwar, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/122,003

(22) Filed: Sep. 5, 2018

(65) Prior Publication Data

US 2019/0096624 A1 Mar. 28, 2019

Related U.S. Application Data

(60) Provisional application No. 62/564,015, filed on Sep. 27, 2017.

(51) Int. Cl.
| | |
|---|---|
| *C23C 16/00* | (2006.01) |
| *H01J 29/07* | (2006.01) |
| *C23C 16/458* | (2006.01) |
| *C23C 16/04* | (2006.01) |
| *H01J 37/32* | (2006.01) |

(52) U.S. Cl.
CPC .......... *H01J 29/073* (2013.01); *C23C 16/042* (2013.01); *C23C 16/4585* (2013.01); *H01J 37/32477* (2013.01); *H01J 37/32715* (2013.01); *H01J 2229/0716* (2013.01); *H01J 2229/0722* (2013.01)

(58) Field of Classification Search
CPC .......................... C23C 16/042; C23C 16/4585
USPC ...................... 313/407; 204/298.15
See application file for complete search history.

(56) References Cited

U.S. PATENT DOCUMENTS

| | | | | |
|---|---|---|---|---|
| 6,106,631 | A * | 8/2000 | Inoue | C23C 14/566 118/729 |
| 6,773,562 | B1 * | 8/2004 | Inagawa | C23C 14/042 118/500 |
| 7,501,161 | B2 * | 3/2009 | Hou | C23C 16/4585 118/728 |
| 7,771,538 | B2 * | 8/2010 | Hwang | C23C 16/4585 118/728 |
| D631,858 | S * | 2/2011 | Kim | D13/182 |
| 2012/0199477 | A1 * | 8/2012 | Uenosono | C23C 14/50 204/298.15 |
| 2013/0263782 | A1 | 10/2013 | Wang et al. | |
| 2014/0251216 | A1 * | 9/2014 | Wang | C23C 14/042 118/721 |
| 2015/0211120 | A1 * | 7/2015 | Zhao | C23C 16/45591 239/461 |

(Continued)

*Primary Examiner* — Christopher M Raabe
(74) *Attorney, Agent, or Firm* — Patterson + Sheridan, LLP

(57) ABSTRACT

Embodiments of the present disclosure generally relates a shadow frame including two opposing major side frame members adjacent to two opposing minor side frame members coupled together with a corner bracket, wherein the corner bracket includes a corner inlay having legs that extend in directions generally orthogonal to each other.

20 Claims, 5 Drawing Sheets

(56) References Cited

U.S. PATENT DOCUMENTS

2016/0060756 A1\* 3/2016 Park ................... C23C 16/042
                                                    118/725

\* cited by examiner

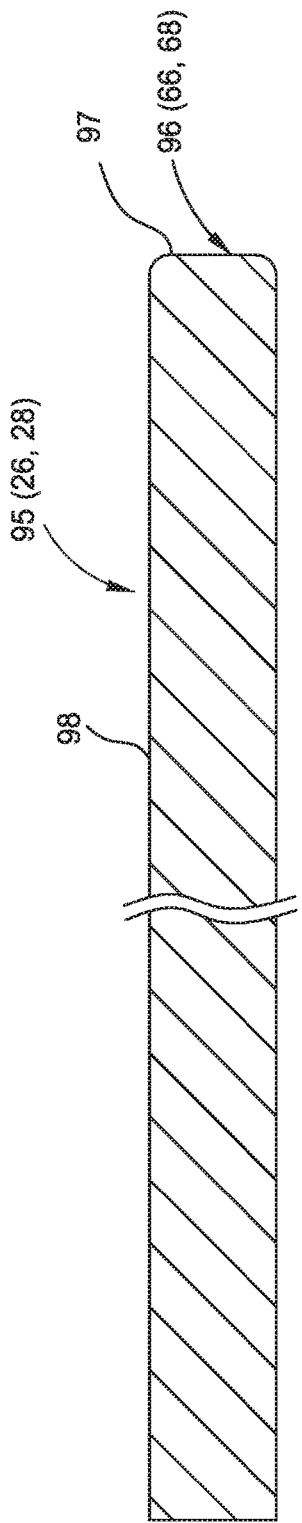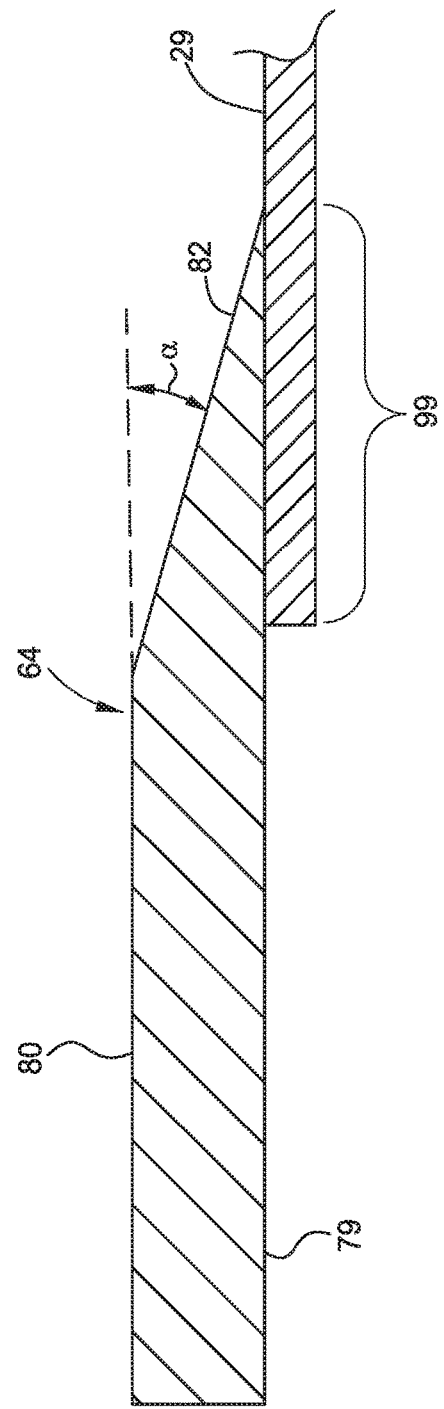

SHADOW FRAME WITH SIDES HAVING A VARIED PROFILE FOR IMPROVED DEPOSITION UNIFORMITY

CROSS-REFERENCE TO RELATED APPLICATION

This application claims benefit of U.S. Provisional Patent Application No. 62/564,015, filed Sep. 27, 2017, which is hereby incorporated by reference herein.

BACKGROUND

Field

Embodiments of the present disclosure generally relate to a shadow frame for use in a plasma processing chamber.

Description of the Related Art

Modern semiconductor devices require the formation of features, such as OLEDs, transistors, and low-k dielectric films, by depositing and removing multiple layers of conducting, semiconducting and dielectric materials from a glass substrate. Glass substrate processing techniques include plasma-enhanced chemical vapor deposition (PECVD), physical vapor deposition (PVD), etching and the like. Plasma processing is widely used in the production of flat panel devices due to the relatively lower processing temperatures required to deposit a film and good film quality which can result from using plasma processes.

In general, plasma processing involves positioning a substrate on a support member (often referred to as a susceptor or heater) disposed in a vacuum chamber and forming a plasma adjacent to the upper exposed surface of the substrate. The plasma is formed by introducing one or more process gases into the chamber and exciting the gases with an electrical field to cause dissociation of the gases into charged and neutral particles. A plasma may be produced inductively, e.g., using an inductive RF coil, and/or capacitively, e.g., using parallel plate electrodes, or by using microwave energy.

During processing, the edge and backside of the glass substrate as well as the internal chamber components must be protected from deposition. Typically, a deposition masking device, or shadow frame, is placed about the periphery of the substrate to prevent processing gases or plasma from reaching the edge and backside of the substrate and to hold the substrate on a support member during processing. The shadow frame may be positioned in the processing chamber above the support member so that when the support member is moved into a raised processing position, the shadow frame is picked up and contacts an edge portion of the substrate. As a result, the shadow frame covers several millimeters of the periphery of the upper surface of the substrate, thereby preventing backside and edge deposition on portions of the substrate covered by the shadow frame.

With consideration of the benefits of using a shadow frame, there are a number of disadvantages with current shadow frame designs. Prior art shadow frames typically reduces deposition on uncovered edges of the substrate near the edges of the shadow frame as compared to deposition inward of the edges of the substrate. This deposition non-uniformity is more exaggerated at the corners of the substrate.

Thus, there is a need in the art for a shadow frame which provides more deposition on the periphery of a substrate.

SUMMARY

Embodiments of the present disclosure generally relate a shadow frame including two opposing major side frame members adjacent to two opposing minor side frame members coupled together with a corner bracket, wherein the corner bracket includes a corner inlay having legs that extend in directions generally orthogonal to each other.

In another embodiment, a shadow frame is disclosed that includes two opposing major side frame members adjacent to two opposing minor side frame members coupled together with a corner bracket at a coupling interface, wherein each corner bracket includes a corner inlay having legs that extend in directions generally orthogonal to each other, and wherein each corner bracket includes a rounded corner.

In another embodiment, a shadow frame is disclosed that includes two opposing major side frame members adjacent to two opposing minor side frame members coupled together with a corner bracket at a coupling interface comprising a recessed area, wherein each corner bracket includes a rounded corner and a corner inlay having legs that extend in directions generally orthogonal to each other, the corner inlay includes a planar upper surface and a sloped planar surface that is angled from a plane of the planar upper surface, and a notch formed at a center of the recessed area

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 5 is a side cross sectional view of a frame member along lines 5-5 of FIG. 4.

FIG. 6 is a side cross sectional view of the corner inlay along lines 6-6 of FIG. 4.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure generally relate to a shadow frame for use in a processing chamber. In one or more embodiments described below, a shadow frame is formed as a multi-piece shadow frame body.

The shadow frame enhances amorphous silicon uniformity because of the narrow edge lip and thus, less shadowing of the substrate. The uniform arrangement of the electrically insulating material also assists in amorphous silicon deposition uniformity. Embodiments of the disclosure are more clearly described with reference to the figures below.

Figure 1:
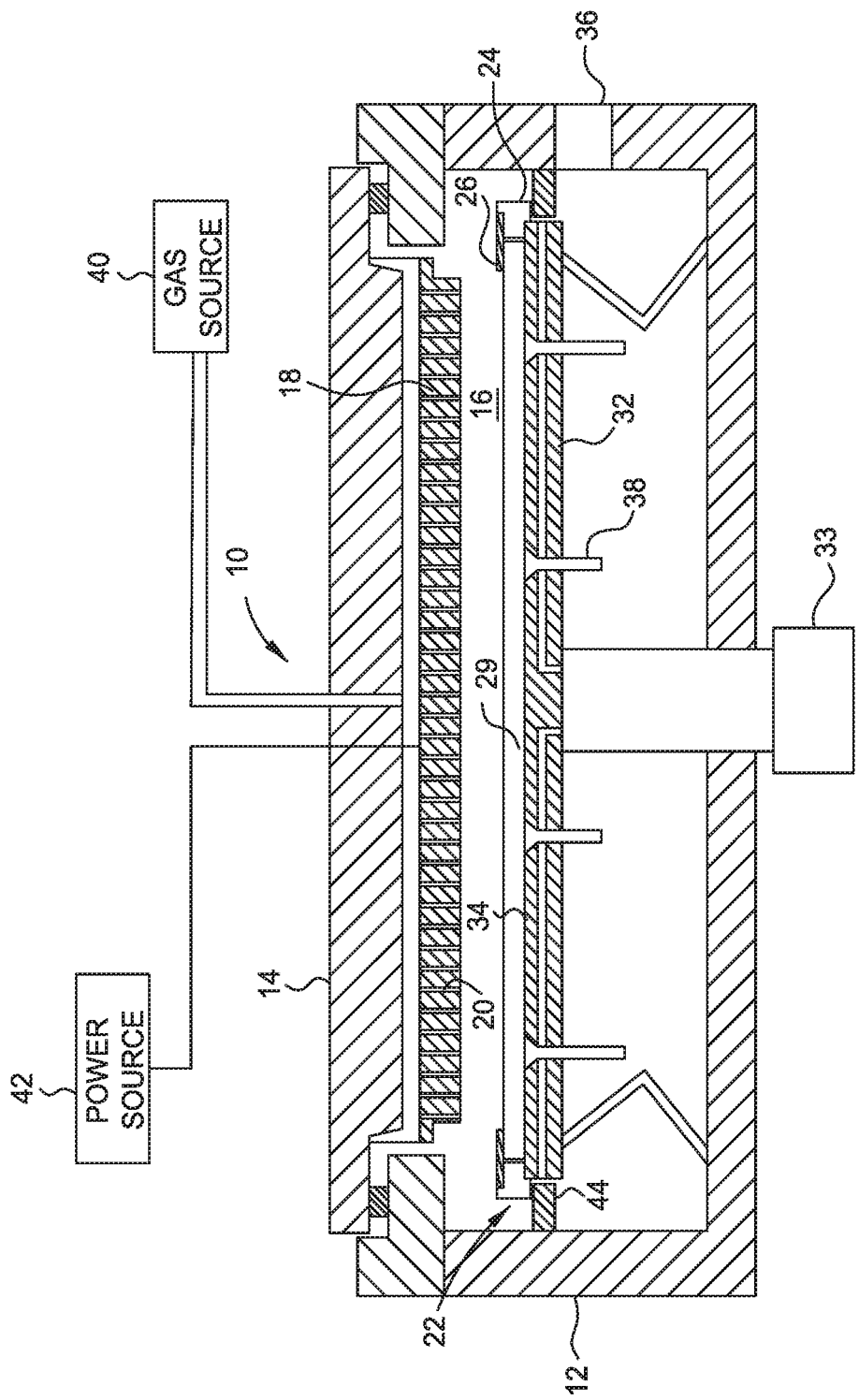
FIG. 1 is a schematic cross sectional view of an exemplary processing chamber with a shadow frame according to one embodiment.

FIG. 1 is a schematic cross sectional view of an exemplary processing chamber 10 with a shadow frame according to one embodiment. One example of the process chamber that may be adapted to benefit from the disclosure is a PECVD process chamber, available from AKT America, Inc, a subsidiary of Applied Materials, Inc., located in Santa Clara, Calif. It is contemplated that other plasma processing chambers, including those from other manufacturers, may be adapted to practice the present disclosure.

The processing chamber 10 comprises a chamber body 12 and a backing plate 14 disposed thereon. The chamber body 12 has a processing region 16. The dimensions of the chamber body 12 and related components of the processing chamber 10 are not limited and generally are proportionally larger than the size of a substrate 29 to be processed. Any suitable substrate size may be processed. Examples of suitable substrate sizes include substrate having a surface area of about 5,500 centimeter square or more, such as about 25,000 centimeter square or more, for example about 50,000 centimeter square or more. In one embodiment, a substrate having a surface area of about 100,000 centimeter square or more may be processed.

A gas distribution plate 18 is mounted to the backing plate 14 and defines the upper boundary of the processing region 16. A plurality of holes 20 are formed in the gas distribution plate 18 to allow delivery of processing gases therethrough. A gas source 40 can deliver a gas to the plenum formed between the gas distribution plate 18 and the backing plate 14 so as to evenly distribute the processing gas and thus, uniformly deliver the processing gas through the gas distribution plate 18. A power source 42 is electrically coupled to the gas distribution plate 18 to create a plasma from the processing gas that flows through the holes 20. The substrate support 32 is almost entirely made of aluminum or another conductive metal to function as a counter-electrode to the gas distribution plate 18. The power source 42 can be any type of power source used in PECVD chambers, such as a RF power source. A shadow frame 22 is shown disposed on a substrate support 32. The shadow frame 22 includes a shadow frame body 24 with a frame member 26 affixed thereto.

The chamber body 12 also includes a shadow frame support 44 which is formed annularly around the substrate support 32. When the substrate support 32 is in a lowered position, the shadow frame 22 is supported by the shadow frame support 44.

The substrate support 32, also referred to as a susceptor or heater, is disposed in the processing chamber 10 and is actuated by a motor 33. In a raised processing position, the substrate support 32, having the substrate 29 disposed on a substrate supporting surface 34 thereof, supports the shadow frame body 24 of the shadow frame 22 and defines the lower boundary of the processing region 16 such that the substrate 29 is positioned in the processing region 16. The frame member 26 both extends over and contacts a portion of the substrate 29 while the shadow frame body 24 rests on the substrate supporting surface 34.

The substrate 29 is introduced into and removed from the processing chamber 10 through an opening 36 formed in the chamber body 12 which is selectively sealed by a slit valve mechanism (not shown). Lift pins 38 are slidably disposed through the substrate support 32 and can be adapted to hold a substrate at an upper end thereof. The lift pins 38 can be actuated by lowering the substrate support 32 using the motor 33.

Figure 2:
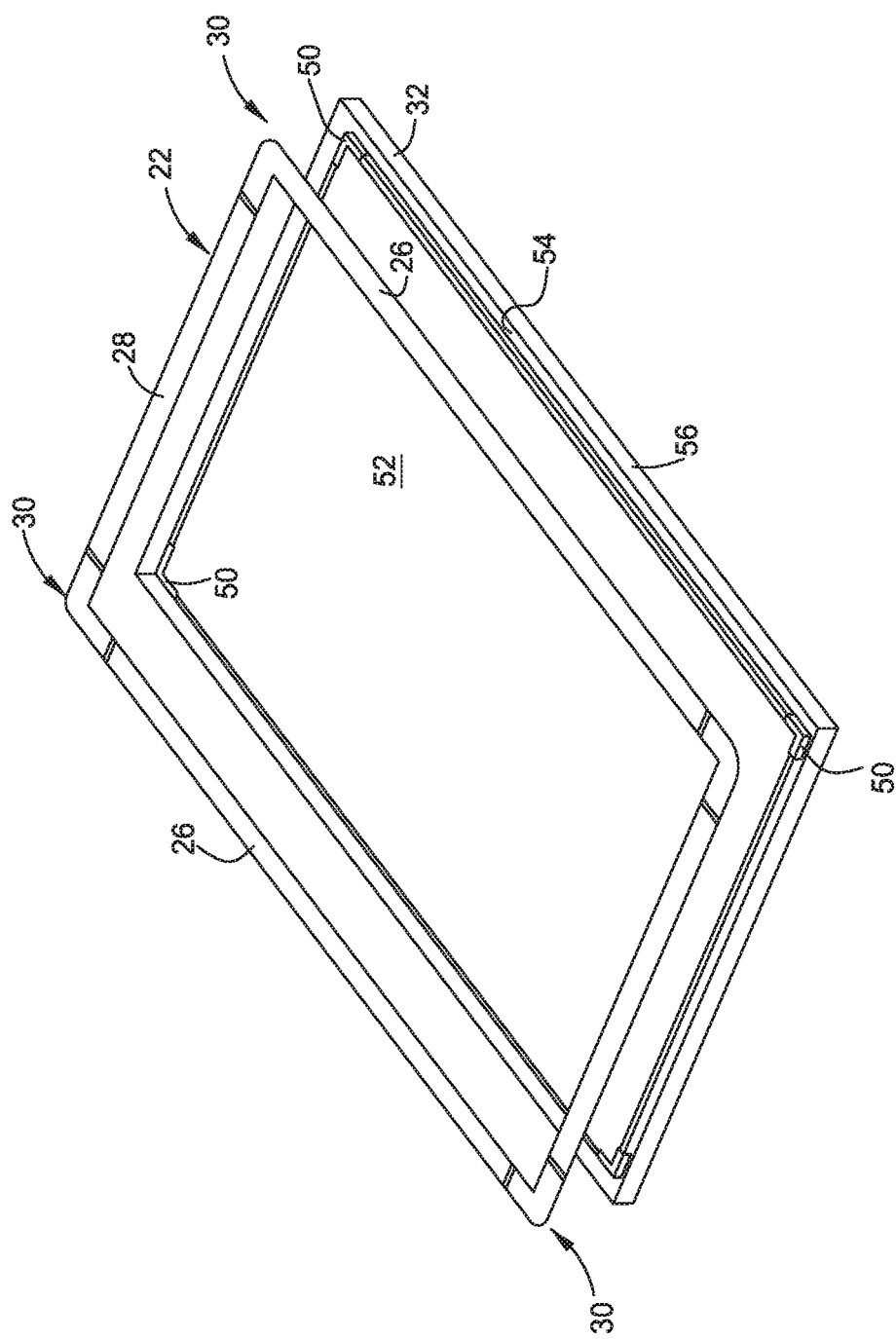
FIG. 2 is an isometric view of the substrate support of FIG. 1 and a shadow frame according to one embodiment.

FIG. 2 is an isometric view of the substrate support 32 of FIG. 1 and a shadow frame 22 according to one embodiment. The shadow frame 22 includes two opposing major side frame members 26 adjacent to two opposing minor side frame members 28. Each of the major side frame members 26 are coupled to the minor side frame members 28 by corner brackets 30. Additionally, the substrate support 32 includes corner inlays 50 at the interface between a substrate receiving surface 52 and a peripheral ledge 54 of the substrate support 32. As mentioned above, a body 56 of the substrate support 32 is made of aluminum or other electrically conductive material in order to function as a counter-electrode in conjunction with the gas distribution plate 18. However, the corner inlays 50 may be made of a ceramic material that is recessed within a pocket formed in the body 56. The corner inlays 50 may reduce arcing in a case where a substrate is slightly misaligned with the substrate receiving surface 52 of the substrate support 32.

Figure 3:
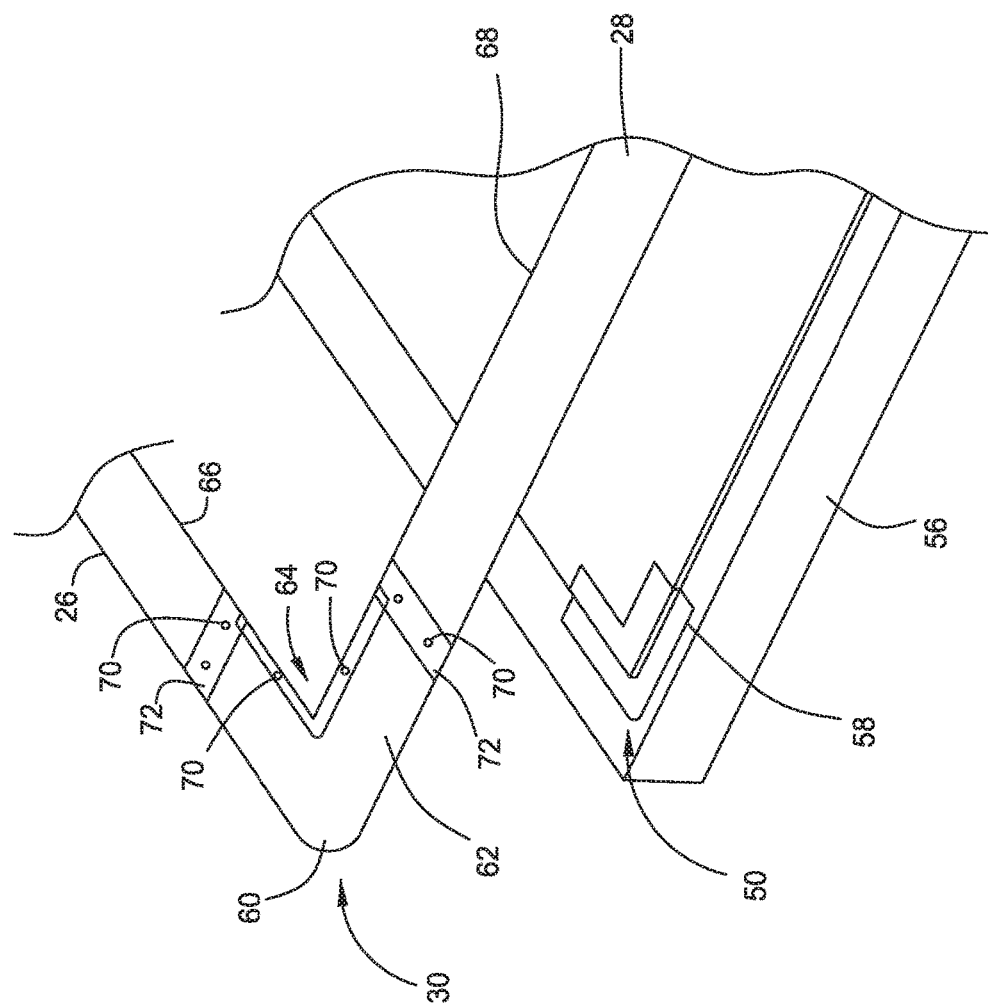
FIG. 3 is an enlarged isometric view of the substrate support and the shadow frame of FIG. 2.

FIG. 3 is an enlarged isometric view of the substrate support 32 and the shadow frame 22 of FIG. 2. The corner inlay 50 is shown in a pocket 58 formed in the body 56 of the substrate support 32. The corner bracket 30 is also shown coupling a minor side frame member 28 with a major side frame member 26. The corner bracket 30 includes a radiused or rounded corner 60 and a leg 62 that extends orthogonally from a longitudinal direction of the major side frame member 26. In one aspect, the major side frame members 26, which include the leg 62 on opposing ends thereof, have a "C" shape. The corner bracket 30 also includes a corner inlay 64 coupled to an inner peripheral edge 66, 68, of the major side frame member 26 and the minor side frame member 28, respectively. The corner inlay 64 may be fastened to the major side frame member 26 using a fastener 70. A seam cover 72 may be included to cover the interface between the major side frame member 26, the corner inlay 64, and the minor side frame member 28. Fasteners 70 may be utilized to secure the seam cover 72 to the major side frame member 26. All of the corner inlay 64, the fasteners 70, the major side frame member 26, the minor side frame member 28, and the seam cover 72 may be made of a ceramic material.

Figure 4:
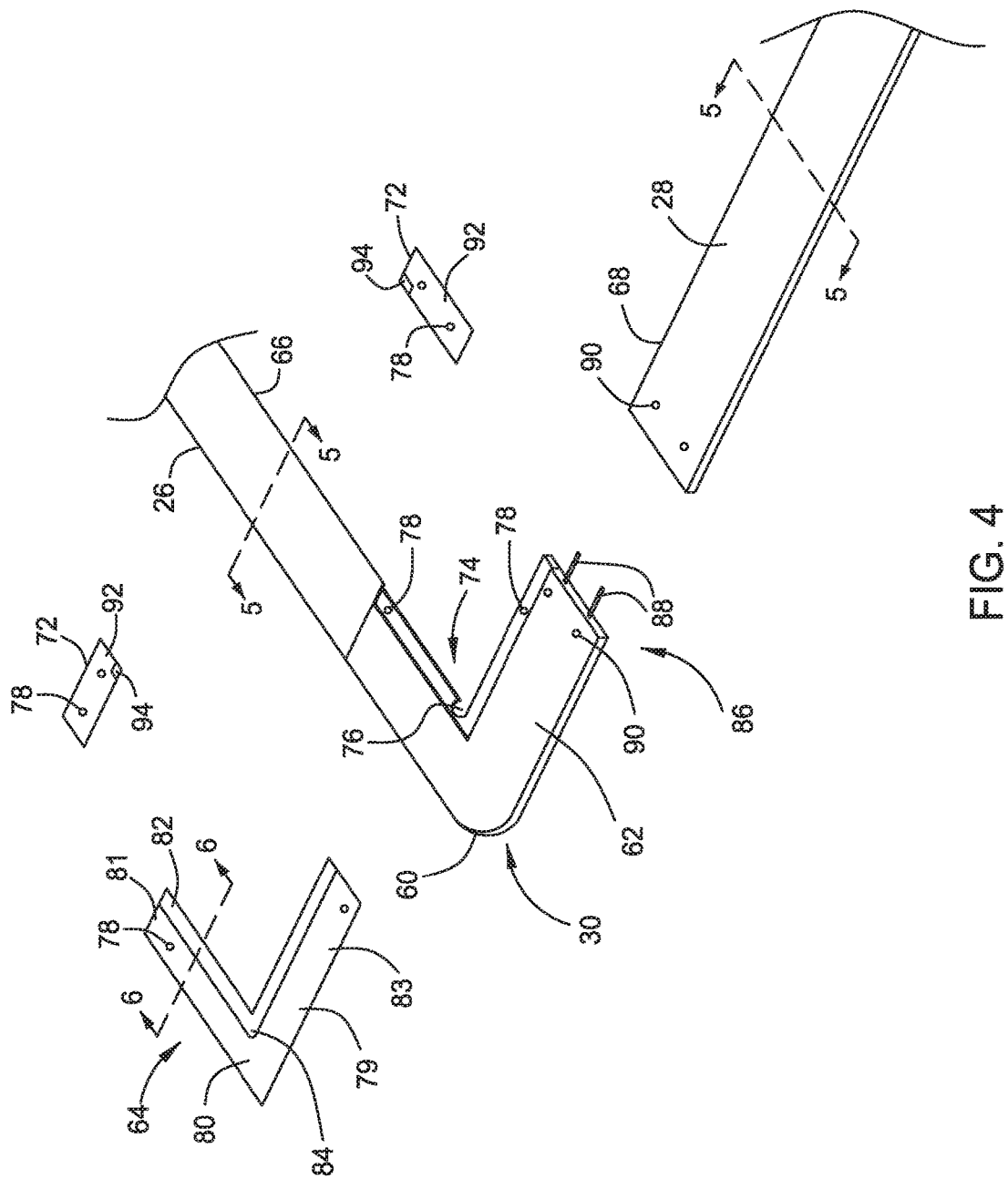
FIG. 4 is an exploded isometric view of the corner bracket.

FIG. 4 is an exploded isometric view of the corner bracket 30. The major side frame member 26 includes a recessed area 74 where the corner inlay 64 may be placed. As a 90 degree corner may be difficult to form in the recessed area 74, a radius or notch 76 may be provided on an inner edge of the recessed area 74. Openings 78 are included in the recessed area 74 for the fasteners 70 shown in FIG. 3.

The corner inlay 64 includes a body 79 having a planar surface 80 transitioning to a tapered or sloped planar surface 82. Openings 78 are formed in the body 79 for receiving the fasteners 70 shown in FIG. 3. The body 79 includes two legs 81 and 83 that extend in directions generally orthogonal to each other. The intersection of the sloped planar surface 82 on each leg 81 and 83 includes a radius corner 84.

A coupling interface 86 is utilized to couple the major side frame member 26 to the minor side frame member 28. The coupling interface 86 includes a plurality of pins 88. The pins 88 are inserted into openings formed in edges of the major side frame member 26 and the minor side frame member 28. Fasteners 90 may be utilized to secure the pins 88 in the major side frame member 26 and the minor side frame member 28. The pins 88 may be a metallic material, such as aluminum. The fasteners 90 may be made of a ceramic material.

Each of the seam covers 72 include a first surface 92 and a recessed second surface 94 below a plane of the first surface 92. The recessed second surface 94 may be angled to substantially match the angle of the sloped planar surface 82 of the corner inlay 64.

FIG. 5 is a side cross sectional view of a frame member 95 along lines 5-5 of FIG. 4. The frame member 95 may be either of the major side frame member 26 or the minor side frame member 28. An inner peripheral edge 96 is shown, which may be the inner peripheral edge 66, 68 of the major side frame member 26 or the minor side frame member 28. The inner peripheral edge 96 includes a planar surface 97 which is orthogonal to a plane of an upper surface 98 of the frame member 95. The inner peripheral edge 96 may be referred to as a "bull nose" configuration.

FIG. 6 is a side cross sectional view of the corner inlay 64 along lines 6-6 of FIG. 4. The sloped planar surface 82 includes an angle α from a plane of the planar surface 80. The angle α may be about 6 degrees to about 8 degrees, such as about 7 degrees. The sloped planar surface 82 may be referred to as a "knife edge" configuration. A substrate coverage area 99 is shown in FIG. 6. The substrate coverage area 99 may be about 7 millimeters, about 5 millimeters, or about 3 millimeters.

Extensive testing was performed utilizing the shadow frame 22 as described herein. Deposition on the edge of substrates adjacent to the inner peripheral edges 66, 68 of the major side frame member 26 and the minor side frame member 28, and the sloped planar surface 82 of the corner inlay 64 showed an increase in thickness profile.

While the foregoing is directed to embodiments of the present disclosure, other and further embodiments of the disclosure may be devised without departing from the basic scope thereof, and the scope thereof is determined by the claims that follow.

The invention claimed is:

1. A shadow frame, comprising:
   two opposing major side frame members adjacent to two opposing minor side frame members coupled together with a corner bracket at intersections therebetween, wherein each corner bracket includes a corner inlay having legs that extend in directions generally orthogonal to each other.

2. The shadow frame of claim 1, wherein the each of the corner brackets include a seam cover positioned at an interface between a respective corner inlay and a major side member of the two opposing major side frame members and a minor side member of the minor side frame members.

3. The shadow frame of claim 2, wherein the corner inlay includes a sloped planar surface angled from a plane of a planar upper surface.

4. The shadow frame of claim 3, wherein the sloped planar surface is formed at an angle of about 7 degrees from the planar upper surface.

5. The shadow frame of claim 2, wherein the seam covers have a first surface and a second surface.

6. The shadow frame of claim 5, wherein the second surface is recessed below a plane of the first surface.

7. The shadow frame of claim 6, wherein the corner inlay includes a sloped planar surface angled from a plane of a planar upper surface.

8. The shadow frame of claim 7, wherein second surface is angled to substantially match an angle of the sloped planar surface.

9. The shadow frame of claim 1, wherein the corner bracket includes a rounded corner.

10. A shadow frame, comprising:
    two opposing major side frame members adjacent to two opposing minor side frame members coupled together with a corner bracket at a coupling interface, wherein each corner bracket includes a corner inlay having legs that extend in directions generally orthogonal to each other, and wherein each corner bracket includes a rounded corner.

11. The shadow frame of claim 10, wherein the coupling interface includes a plurality of pins.

12. The shadow frame of claim 10, wherein the coupling interface includes a seam cover.

13. The shadow frame of claim 12, wherein the seam covers have a first surface and a second surface.

14. The shadow frame of claim 13, wherein the second surface is recessed below a plane of the first surface.

15. The shadow frame of claim 14, wherein the corner inlay includes a sloped planar surface angled from a plane of a planar upper surface.

16. The shadow frame of claim 15, wherein second surface is angled to substantially match an angle of the sloped planar surface.

17. A shadow frame, comprising:
    two opposing major side frame members adjacent to two opposing minor side frame members coupled together with a corner bracket at a coupling interface comprising a recessed area, wherein:
    each corner bracket includes a rounded corner and a corner inlay having legs that extend in directions generally orthogonal to each other;
    the corner inlay includes a planar upper surface and a sloped planar surface that is angled from a plane of the planar upper surface; and
    a notch formed at a center of the recessed area.

18. The shadow frame of claim 17, wherein the coupling interface includes a seam cover.

19. The shadow frame of claim 18, wherein the seam covers have a first surface and a second surface.

20. The shadow frame of claim 19, wherein the second surface is recessed below a plane of the first surface.

* * * * *